United States Patent
Zhang

(10) Patent No.: US 12,494,792 B2
(45) Date of Patent: Dec. 9, 2025

(54) LOW PASS FILTER FOR TROSA HIGH FREQUENCY RESPONSE SUPPRESSION

(71) Applicant: Infinera Corporation, San Jose, CA (US)

(72) Inventor: Jiaming Zhang, Macungie, PA (US)

(73) Assignee: Infinera Corporation

( * ) Notice: Subject to any disclaimer, the term of this patent is extended or adjusted under 35 U.S.C. 154(b) by 64 days.

(21) Appl. No.: 18/119,769

(22) Filed: Mar. 9, 2023

(65) Prior Publication Data

US 2023/0291410 A1    Sep. 14, 2023

Related U.S. Application Data

(60) Provisional application No. 63/318,389, filed on Mar. 9, 2022.

(51) Int. Cl.
*H03M 1/00* (2006.01)
*H03M 1/06* (2006.01)
*H03M 1/66* (2006.01)

(52) U.S. Cl.
CPC ......... *H03M 1/0626* (2013.01); *H03M 1/662* (2013.01)

(58) Field of Classification Search
CPC .......... H03M 3/43; H03M 3/456; H03M 1/08; H03M 1/12; H03M 1/121; H03M 1/123; H03M 1/1245; H03M 1/1265; H03M 1/145; H03M 1/146; H03M 1/168; H03M 1/361; H03M 1/46; H03M 1/662; H03M 1/74; H03M 1/745; H03M 13/1102; H03M 13/2957; H03M 13/31; H03M 13/6561; H03M 3/402; H03M 3/424; H03M 3/434; H03M 3/496; H03M 5/02; H03M 1/0624; H03M 1/0626; H03M 1/0629; H03M 1/0854; H03M 1/1028; H03M 1/1033; H03M 1/181; H03M 1/70; G02F 7/00; H04B 10/25; H04B 10/2572; H04B 10/516; H04B 10/524; H04B 10/548; G01S 17/34; G01S 7/4911; G01S 7/4912
USPC ................................................. 341/137, 144
See application file for complete search history.

(56) References Cited

U.S. PATENT DOCUMENTS

| | | | | |
|---|---|---|---|---|
| 3,879,690 | A * | 4/1975 | Golant | H01P 1/2039 333/204 |
| 6,255,920 | B1 * | 7/2001 | Ohwada | H01P 1/2039 333/202 |
| 8,067,999 | B2 * | 11/2011 | Ebisawa | H02J 3/01 333/185 |
| 8,115,574 | B2 * | 2/2012 | Adkins | H01P 1/202 333/24 C |
| 8,704,611 | B2 * | 4/2014 | Podell | H03H 7/46 333/185 |
| 9,407,361 | B1 * | 8/2016 | Zhang | H04B 10/541 |
| 2003/0112101 | A1 * | 6/2003 | Tsunoda | H01P 1/202 333/206 |
| 2013/0144365 | A1 * | 6/2013 | Kipke | A61B 5/4064 607/148 |

(Continued)

*Primary Examiner* — Linh V Nguyen

(57) ABSTRACT

Consistent with the present disclosure, low pass filters are provided in the electrical paths connecting digital to analog converter (DAC) circuitry to an optical block package (also referred to as a "gold box"). The low pass filter blocks or substantially attenuates high frequency noise components present in an analog signal output from the DAC, thereby reducing errors that might otherwise be present in the transmitted data.

17 Claims, 6 Drawing Sheets

(56) References Cited

U.S. PATENT DOCUMENTS

| | | | |
|---|---|---|---|
| 2014/0169793 A1* | 6/2014 | Harley | H04B 10/616 |
| | | | 398/79 |
| 2019/0149390 A1* | 5/2019 | Torbatian | H04L 27/362 |
| | | | 375/298 |
| 2020/0195352 A1* | 6/2020 | Cavaliere | H04B 10/5167 |
| 2021/0194594 A1* | 6/2021 | Kawakami | H04B 10/54 |
| 2022/0014300 A1* | 1/2022 | Torbatian | H04B 10/516 |
| 2022/0178821 A1* | 6/2022 | Miller, II | G01M 3/04 |

* cited by examiner

LOW PASS FILTER FOR TROSA HIGH FREQUENCY RESPONSE SUPPRESSION

BACKGROUND

The present patent application hereby claims priority to the provisional patent application identified by U.S. Ser. No. 63/318,389 filed on Mar. 9, 2022, the entire content of which is hereby incorporated by reference.

In optical communication systems, optical signals are transmitted from a transmitter to a receiver. Each optical signal can carry a respective data stream and have an associated frequency or wavelength. In order to increase the data-carrying capacity of an optical communication system, the optical signal frequencies may be spectrally spaced close to one another. In addition, the data or symbol rate associated with each optical signal may be increased.

A digital signal processor may be provided in the transmitter that processes incoming data and provides digital signals. The digital signals are then converted to analog signals by a digital-to-analog converter (DAC) circuit, and the analog signals may be subject to further processing. The processed analog signals, also referred to as drive signals, are next applied to one or more optical modulators, which modulate light output from a laser to provide the transmitted optical signals.

At higher data and symbol rates, however, electrical signals in the DAC may interfere with one another. Such interference may be observed, as so-called "aliasing," which can be a significant source of noise in the analog signals, as well as the drive signals and the transmitted optical signals.

SUMMARY

Consistent with an aspect of the present disclosure, a transceiver is provided including a digital signal processor that provides digital signals to a digital-to-analog converter (DAC) circuit, which, in turn, provides analog signals. The analog signals are transmitted along electrical paths to optical circuitry. The electrical paths include a low pass filter to block high frequency components of the analog signal, thereby eliminating or substantially reducing noise in the analog signals.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) and together with the description, serve to explain the principles of the invention.

DESCRIPTION OF THE EMBODIMENTS

Consistent with the present disclosure, low pass filters are provided in the electrical paths connecting digital to analog converter (DAC) circuitry to an optical block package (also referred to as a "gold box"). The low pass filter blocks or substantially attenuates high frequency noise components present in an analog signal output from the DAC, thereby reducing errors that might otherwise be present in the transmitted data.

In addition, additional low pass filters are provided in the electrical signal paths connecting transimpedance amplifiers (TIAs) and/or automatic gain control circuits (AGCs) with analog-to-digital conversion (ADC) circuitry in the receiver portion of the TROSA. The additional low pass filters also reduce or attenuate high frequency components in the analog signals supplied from the TIAs and/or AGCs to the ADC circuitry, thereby further reducing errors in the received data.

Reference will now be made in detail to the present exemplary embodiments of the present disclosure, which are illustrated in the accompanying drawings. Wherever possible, the same reference numbers will be used throughout the drawings to refer to the same or like parts.

Figure 1:
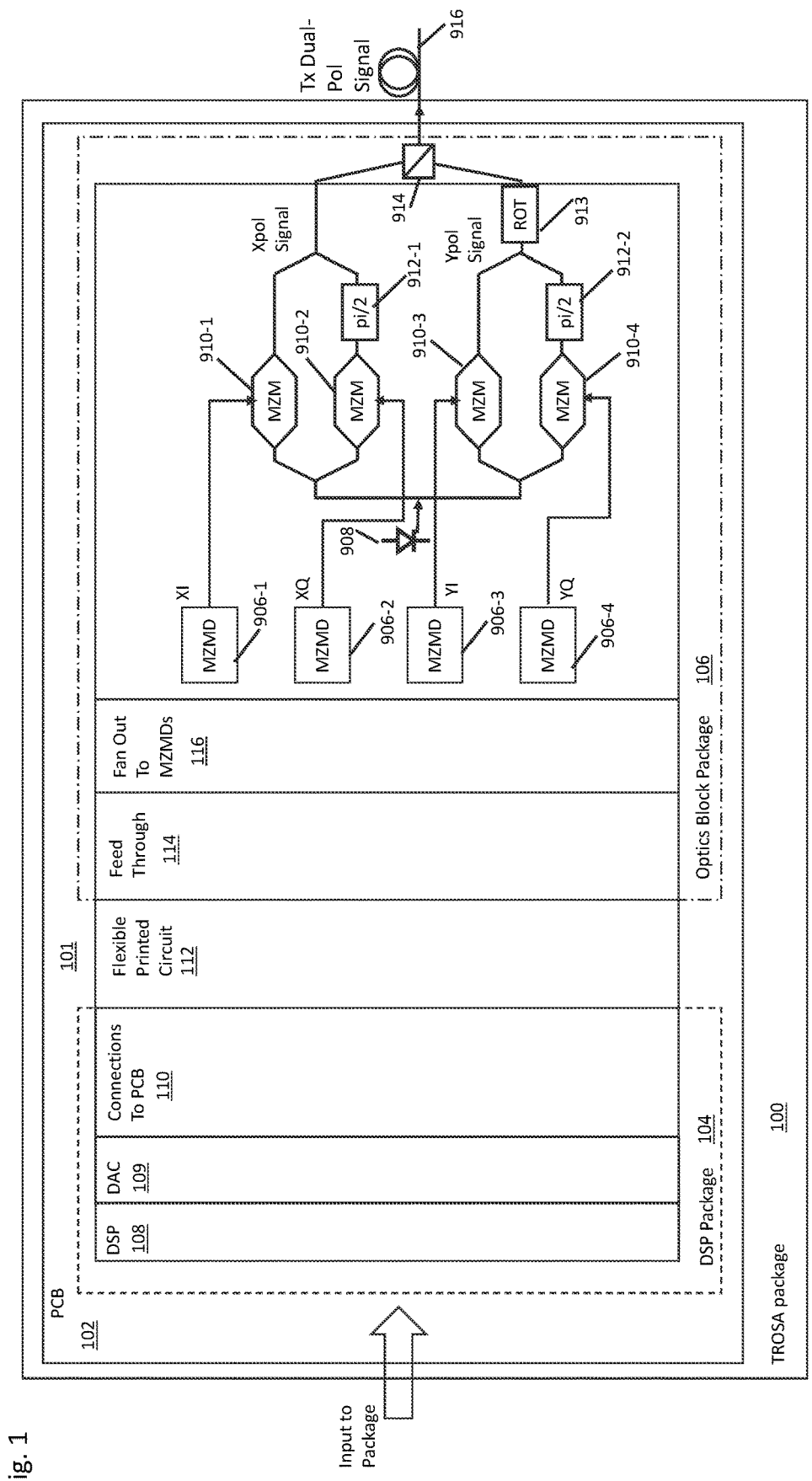
FIG. 1 illustrates a transmitter portion of a transmitter receiver optical sub-assembly (TROSA) consistent with an aspect of the present disclosure.

FIG. 1 illustrates a transmitter portion 101 included in a TROSA package 100. Transmitter portion 101 includes a DSP package 104 and an optics block package 106, both of which are provided on a printed circuit board (PCB) 102. DSP package 104 includes a digital signal processor (DSP) 108 and DAC circuitry 109. The analog signals supplied by DAC circuitry 109 are transmitted over electrical paths including conductors in connections 110 to PCB 102, conductors in a flexible printed circuit 112, conductors in a feed through of package 106, and conductors of a fan out 116 that connect to Mach-Zehnder modulator driver circuits (MZMDs) 906-1 to 906-4.

In operation, data is input to TROSA package 100 and provided to DSP 108. The data is processed in DSP 108, which outputs digital signals to DAC 109. Based on the digital signals, DAC 109 provides analog signals to PCB connections 110. The analog signals next propagate to conductors in flexible printed circuit 112 and then to conductors in feed through 114. Conductors in fan out 116 receive the analog signals and supply the analog signal to MZMDs 906-1 to 906-4. Each MZMD in turn generates modulator drive signals for driving a respective one of modulators 910-1 to 910-4.

Each of the modulators 910-1 to 910-4 may be a Mach-Zehnder modulator (MZM) that modulates the phase and/or amplitude of the light output from laser 908. As further shown in FIG. 1, a light beam output from laser 908 (also included in package 106) is split such that a first portion of the light is supplied to a first MZM pairing including MZMs 910-1 and 910-2 and a second portion of the light is supplied to a second MZM pairing including MZMs 910-3 and 910-4.

The first portion of the light is further split into third and fourth portions, such that the third portion is modulated by MZM 910-1 to provide an in-phase (I) component of an X (or TE) polarization component of a modulated optical signal, and the fourth portion is modulated by MZM 910-2 and fed to phase shifter 912-1 to shift the phase of such light by 90 degrees in order to provide a quadrature (Q) component of the X polarization component of the modulated optical signal.

Similarly, the second portion of the light is further split into fifth and sixth portions, such that the fifth portion is modulated by MZM 910-3 to provide an I component of a Y (or TM) polarization component of the modulated optical signal, and the sixth portion is modulated by MZM 910-4 and fed to phase shifter 912-2 to shift the phase of such light by 90 degrees to provide a Q component of the Y polarization component of the modulated optical signal.

The optical outputs of MZMs 910-1 and 910-2 are combined to provide an X polarized optical signal including I and Q components and fed to a polarization beam combiner (PBC) 914 provided in block 901. In addition, the outputs of MZMs 910-3 and 910-4 are combined to provide an optical signal that is fed to polarization rotator 913, further provided in block 901, that rotates the polarization of such optical signal to provide a modulated optical signal having a Y (or TM) polarization. The Y polarized modulated optical signal is also provided to PBC 914, which combines the X and Y polarized modulated optical signals to provide a polarization multiplexed ("dual-pol") modulated optical signal onto optical fiber 916, which extends from package 106 outside of TROSA package 100.

Figure 6:
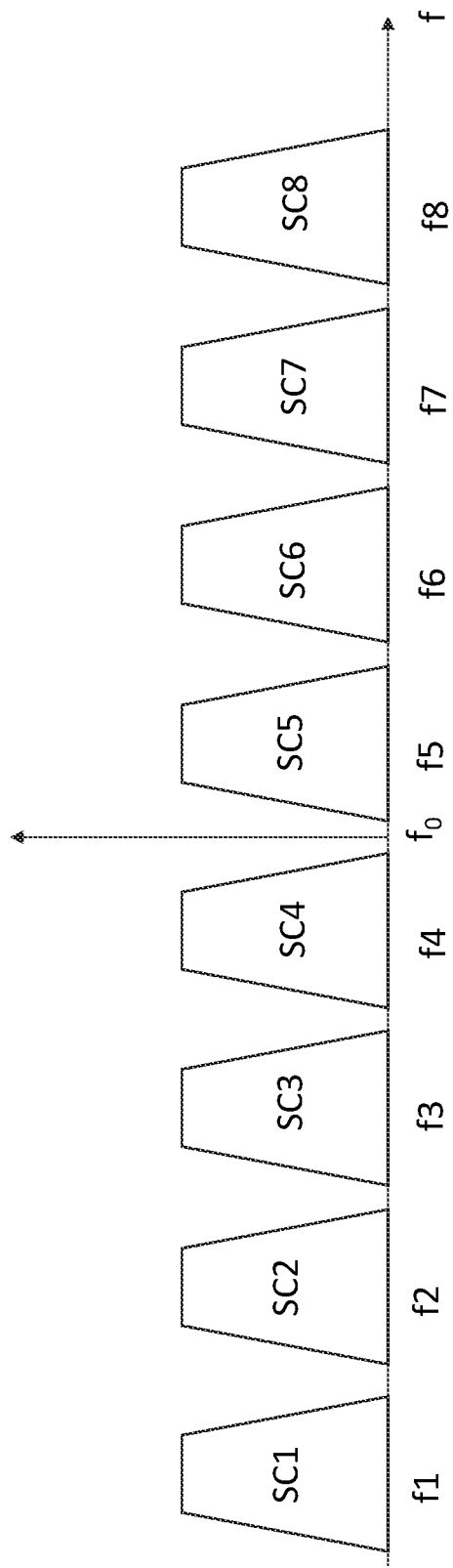
FIG. 6 shows an example of a power spectral density plot associated with optical subcarriers consistent with an aspect of the present disclosure.

In some implementations, the polarization multiplexed optical signal output from package 100 includes optical subcarriers SC1 to SC8, as shown in FIG. 6, which is a power spectral density plot of optical subcarriers SC1 to SC8. Namely, such optical subcarriers SC1 to SC8 are generated by modulating light output from a laser 908. The frequency of such laser output light is f0 and is typically a center or carrier frequency such that half the subcarrier subcarriers, e.g., f5 to f8, are above f0 and half the subcarrier frequencies, e.g., f1 to f4, are below f0. In one example, each of optical subcarriers SC1 to SC8 is a Nyquist subcarrier. Nyquist subcarriers is a group of optical signals, each carrying data, wherein (i) the spectrum of each such optical signal within the group is sufficiently non-overlapping such that the optical signals remain distinguishable from each other in the frequency domain, and (ii) such group of optical signals is generated by modulation of light from a single laser. In general, each subcarrier may have an optical spectral bandwidth that is at least equal to the Nyquist frequency, as determined by the baud rate of such subcarrier.

As noted above, the analog signals generated by DAC 109 can include noise. In order to reduce such noise, low pass filters may be as part of conductors provided in one or more connections 110, flexible printed circuit 112, feed through 114, and fan out 116. In a preferred embodiment, the low pass filters are provided in part of conductors in flexible printed circuit 112.

The receive portion of TROSA package 100 will next be described with reference to FIG. 2. Collectively, the transmit and receiver portions constitute a transceiver provided in package 100.

Figure 2:
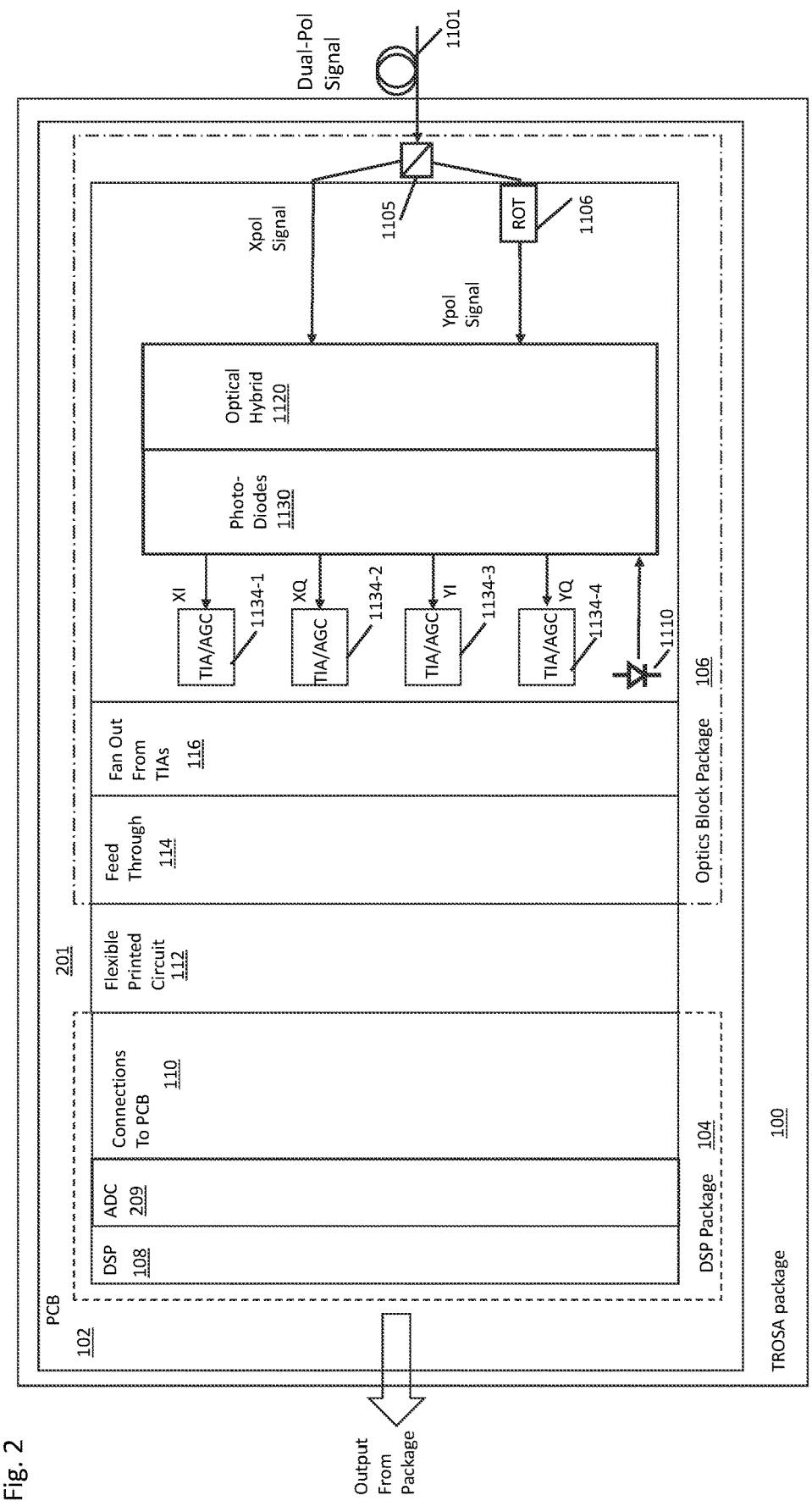
FIG. 2 illustrates a receiver portion of the TROSA consistent with an additional aspect of the present disclosure.

As shown in FIG. 2, receiver portion 201 includes portions of circuitry included in DSP package 104 and optics block package 106. Namely, optics block package 106 includes a polarization splitter 1105 with first and second outputs, a local oscillator (LO) laser 1110, 90 degree optical hybrid circuitry or mixer circuitry 1120, detectors or photodiode circuitry 1130 including individual photodiodes or photodiode pairs, such as balanced photodiode, and AC coupling capacitors (not shown).

In one example, one laser may be provided that is "shared" between the transmitter and receiver portions. In that case, laser 1110 may be omitted.

As further shown in FIG. 2, trans-impedance amplifiers/automatic gain control circuits 1134 ("TIA/AGC 1134") are provided that provide analog signals over conductors including in fan tout 116, feed through 114, flexible circuit 112, and PCB connections to analog-to-digital conversion circuitry 209.

Polarization beam splitter (PBS) 1105 may include a polarization splitter that receives an input polarization multiplexed optical signal including optical subcarriers SC0 to SC8 supplied by optical fiber link 1101. PBS 1105 may split the incoming optical signal into the two X and Y orthogonal polarization components. The Y component may be supplied to a polarization rotator 1106 that rotates the polarization of the Y component to have the X polarization. Optical hybrids 1120 may combine the X and rotated Y polarization components with light from local oscillator laser 1110. For example, optical hybrid circuits may combine a first polarization signal (e.g., the component of the incoming optical signal having a first or X (TE) polarization output from a first port of PBS 1105) with light from local oscillator laser 1110, and combine the rotated polarization signal (e.g., the component of the incoming optical signal having a second or Y (TM) polarization output from a second port of PBS 1105) with the light from local oscillator laser 1110.

Photodiode circuitry 1130 may detect mixing products output from the optical hybrid circuitry 1120, to form corresponding voltage signals, which are subject to AC coupling by capacitors, as well as amplification and gain control by TIA/AGCs 1134-1 to 1134-4. In some implementations, the TIA/AGCs 1134 are used to smooth out or correct variations in the electrical signals output from detector 1130 and the AC coupling capacitors.

As further shown in FIG. 2, the analog signals supplied by TIA/AGCs 1134-1 to 1134-4 are supplied to ADC circuitry 209 by way of conductors included in fan out 116, feed through 114, flexible printed circuit 112, and PCB connections 110. ADC circuitry 209 receives the analog signals and converts the analog signals to digital samples or digital signals, which are then supplied to DSP 108. Based on the received digital signals from ADC 209, DSP 108 outputs the client data from package 104. The output client data is then supplied or output from package 100.

While FIGS. 1 and 2 show TROSA package 100 as including a particular quantity and arrangement of components, in some implementations, TROSA package 100 may include additional components, fewer components, different components, or differently arranged components. In some instances, one of the components illustrated in FIGS. 1 and 2 may carry out a function described herein as being carry outed by another one of the components illustrated in FIGS. 1 and 2.

Consistent with the present disclosure, in order to demodulate subcarriers SC0 to SC8, local oscillator laser 1110 may be tuned to output light having a wavelength or frequency relatively close to one or more of the subcarrier wavelengths or frequencies to thereby cause a beating between the local oscillator light and the subcarriers.

In one of the example, the local oscillator laser may be a semiconductor laser, which may be tuned thermally or through current adjustment. If thermally tuned, the temperature of the local oscillator laser 1110 is controlled with a thin film heater, for example, provided adjacent the local oscillator laser. Alternatively, the current supplied to the laser may be controlled, if the local oscillator laser is current tuned. The local oscillator laser 1110 may be a semiconductor laser, such as a distributed feedback laser or a distributed Bragg reflector laser.

As further noted above, a low pass filter may be provided as part of one or more of the conductors carrying analog signals from the TIA/AGC circuits 1134 to ADC 209. For example, the low pass filter may be provided as part of one of the conductors in one or more of fan out 116, feed through 114, flexible circuit 112, and PCB connections 110. The low pass filter may suppress high frequency components in the analog signals supplied to ADC 209, thereby reducing noise and resulting data errors.

Figure 3:
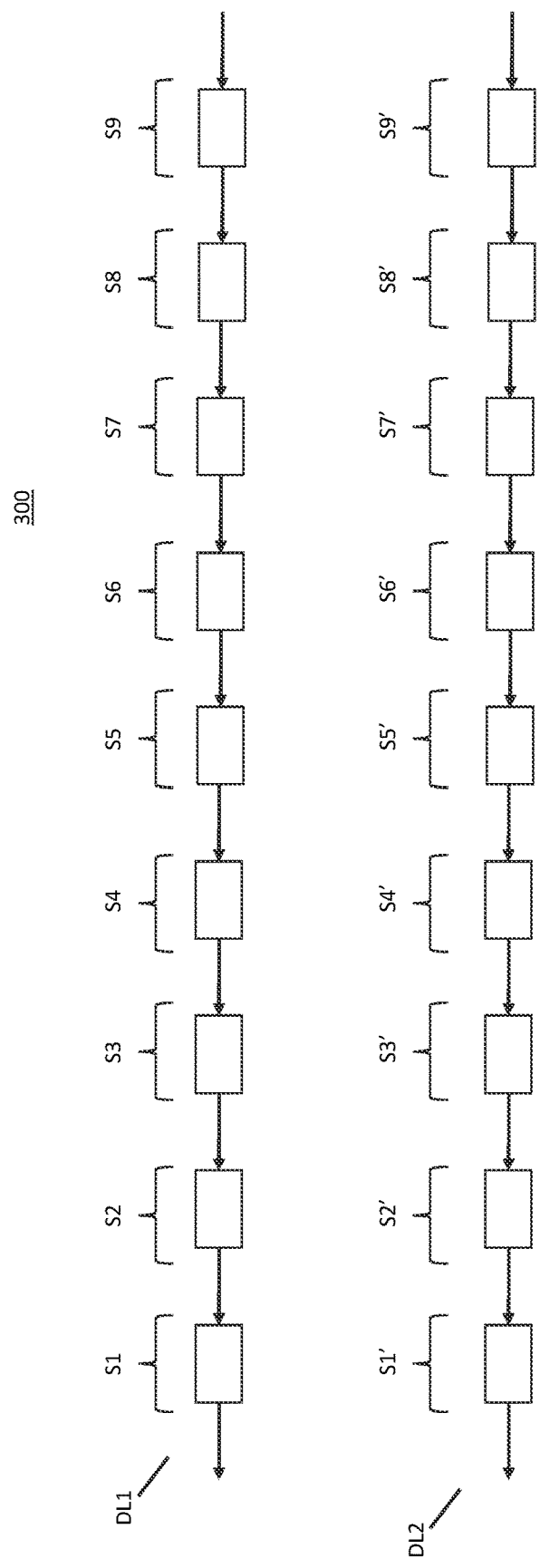
FIG. 3 show a schematic of a low pass filter circuitry consistent with an aspect of the present disclosure.

FIG. 3 shows an example of a low pass filter implementation consistent with the present disclosure. Here, low pass filter 300 includes a plurality of stages S1 to S9 as part of conductors in a first trace DL1, and a plurality of stages S1' to S9' in a second trace DL2. Traces DL1 and DL2 collectively constitute a differential pair in this example. If one trace is desired as a non-differential implementation, one of traces DL1 and DL2 may be omitted. It is noted that more or fewer stages may be provided than that shown in FIG. 3.

Consistent with a further aspect of the present disclosure, each stage has an impedance. For example, stage S9, which may be an input stage that receives an analog signal either output from DAC circuitry 109 or output from TIA/AGC circuits 1134 may have an impedance Z0, and each of stages S8, S6, S4, and S2 may have an impedance Zmin. Stages S7, S5, and S3, on the other hand may have an impedance Zmax, which is greater than Zmin. Preferably, Zmax and Zmin, as well as the number of stages, are selected to yield a predetermined frequency characteristic, as discussed in greater detail below. Stage S1, which may output to MZMDs 906 or output to ADC 209 may also have impedance Z0. Each of stages S1' to S9' of the second trace DL2 have the same impedance as a corresponding one of stages S1 to S9 of trace DL2, in this example.

Figure 4:
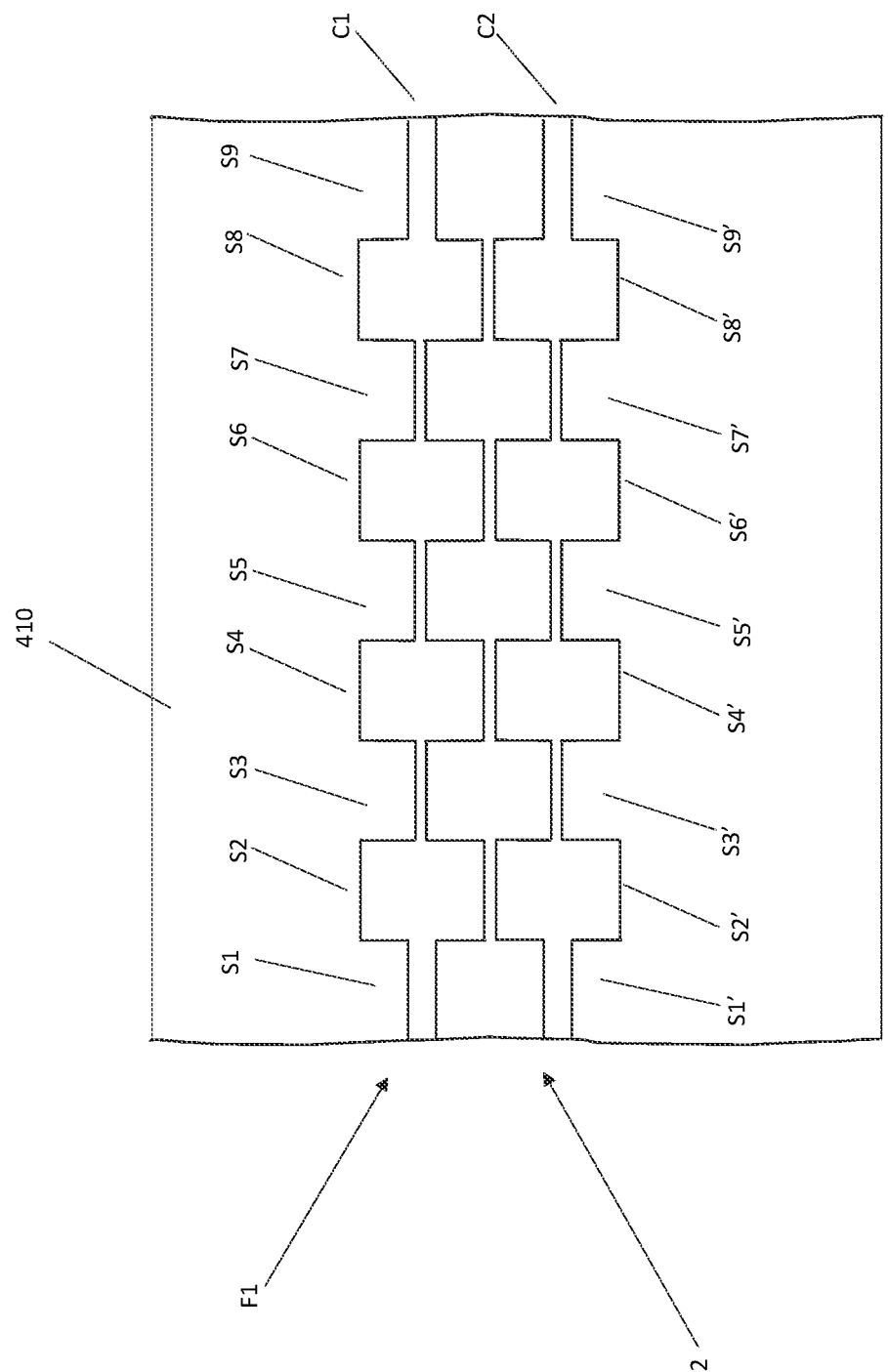
FIG. 4 shows a flexible circuit including a low pass filter consistent with the present disclosure; and illustrates an example of a circuit for controlling an n-channel MOS transistor DAC switch consistent with the present disclosure.

FIG. 4 shows an example implementation of a low pass filter consistent with an additional aspect of the present disclosure. Each of stages S1 to S9 in FIG. 4 correspond to a respective one of stages S1 to S9 in FIG. 3. In addition, each of stages S1' to S9' in FIG. 4 correspond to a respective one of stages S1' to S9' in FIG. 3. In the example shown in FIG. 4, low pass filter F1 includes conductor or trace Cl provided on a flexible substrate, including, for example, polyimide. Low pass filter F1 includes stages S1 to S9 having the impedance noted above. Such impedances are realized by provide different conductor widths for each stage. Namely, the higher impedance, Zmax, noted above, is obtained by selecting a relatively narrow conductor width in stages or sections S3, S5, and S7. Zmin, on the other hand, is realized by providing a wider width in stages S2, S4, S6, and S8. Stages or sections S1 and S9 may have an intermediate width Z0 and may provide a connection between conductors in feed through 114 to PCB connections 110.

Selected traces or conductors, such as those shown in FIGS. 3 and 4 may carry analog signals in a first direction to MZMDs 906 as part of transmit portion 101, and other traces or conductors, such as those shown in FIGS. 3 and 4 may carry analog signals in a second direction to ADC circuitry 209 as part of receiver portion 201.

Figures 5A, 5B, 5C:
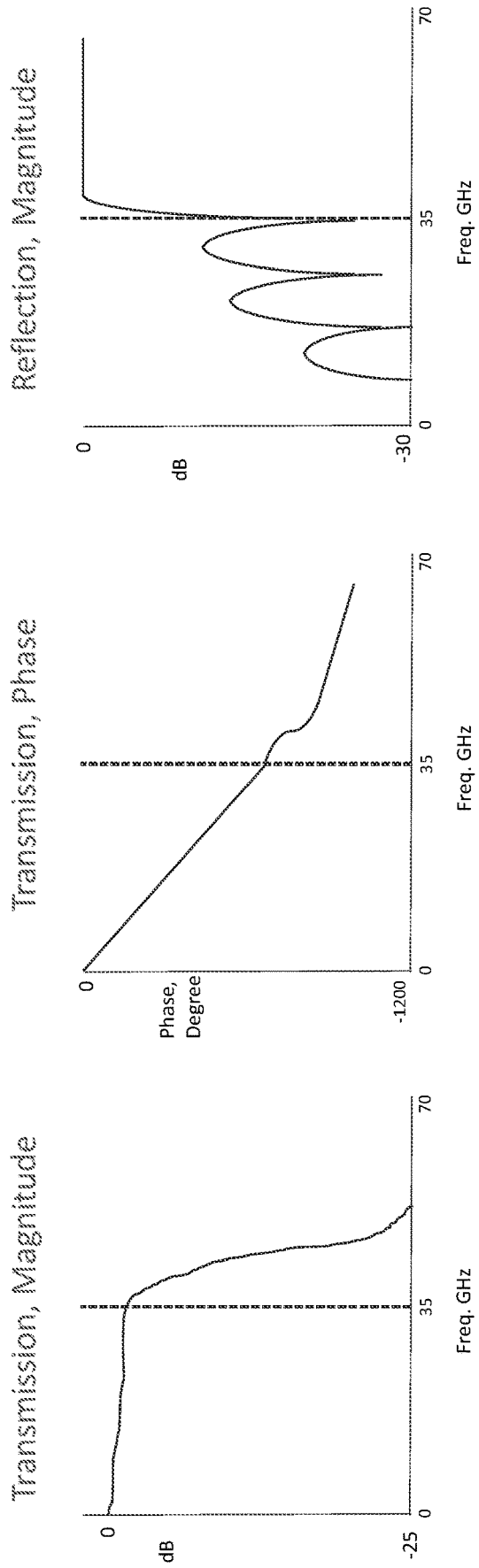
FIGS. 5a-5c show plots of various characteristics of the low pass filter consistent with the present disclosure.

FIG. 5a shows a plot of transmission through an example low pass filber consistent with the present disclosure. As shown in the example of FIG. 5a, frequencies less than a predetermined frequency, such as 35 GHz, are associated with signal carrying data, and frequencies above the predetermined frequency are associated with the above-described noise. Consistent with the present disclosure, transmission through the filter is 0 dB or between 0 and −1 dB, i.e., with little loss, at frequencies less than 35 GHz, whereas frequencies greater than 35 GHz are suppressed or attenuated. Thus, the low pass filter consistent with the present invention facilitates transmission, in this example, of frequencies less than 35 GHz associated with the analog signals, while suppressing or attenuating frequencies greater than 35 GHz. In addition, phase associated with analog signals is linear at frequencies less than 35 GHz (see FIG. 5b), and, as shown in FIG. 5c, undesirable signals at frequencies greater than 35 GHz at are reflected by the example filter consistent with the present disclosure. In addition, reflected signals at desired frequencies associated with signals carrying data have significant loss because nearly all the energy associated with those signals is transmitted through the filter, as indicated in FIG. 5a.

In FIGS. 1 and 2, portions of DSP 108 may be used as part of the transmitter portion 101 to generate modulated optical signals and other portions of DSP 108 may be used as part of receiver portion 201 to process data associated with received optical signals.

Other embodiments will be apparent to those skilled in the art from consideration of the specification. It is intended that the specification and examples be considered as exemplary only, with a true scope and spirit of the invention being indicated by the following claims.

What is claimed is:

1. A transmitter optical sub-assembly package comprising:
   digital to analog conversion circuitry operable to provide an analog signal based on a digital signal the transmitter optical sub-assembly package is operable to receive;
   at least one modulator driver circuit; and
   a low pass filter communicatively connected along an electrical path extending between the digital to analog conversion circuitry and the at least one modulator driver circuit, the low pass filter circuit being operable to attenuate frequencies associated with the analog signal that are greater than a predetermined frequency, wherein the low pass filter comprises a first plurality of stages along a first conductor trace, the first plurality of stages each having a respective impedance value selected from a group of impedance values comprising a minimum impedance value ($Z_{min}$), a maximum impedance value ($Z_{max}$) greater than $Z_{min}$, and at least a third impedance value (Z) greater than $Z_{min}$ and less than $Z_{max}$; and
   wherein the first plurality of stages comprises at least three stages each having an impedance value $Z_{min}$;
   at least four stages each having an impedance value $Z_{max}$; and
   at least two stages each having an impedance value Z.

2. The transmitter optical sub-assembly package of claim 1, wherein the first plurality of stages further comprises a fourth stage having an impedance value selected from a group of impedance values comprising $Z_{min}$, $Z_{max}$, and Z.

3. The transmitter optical sub-assembly package of claim 1, further comprising a select portion of the transmitter optical sub-assembly package selected from a group consisting of:
   a fan out portion;
   a feed through portion;
   a flexible circuit portion; and
   a PCB connection portion.

4. The transmitter optical sub-assembly package of claim 3, wherein the select portion of the transmitter optical sub-assembly package is at least the flexible circuit portion.

5. The transmitter optical sub-assembly package of claim 1, wherein a flexible substrate comprises at least a portion of the low pass filter.

6. The transmitter optical sub-assembly package of claim 1, wherein the low pass filter further comprises a second plurality of at least nine stages along a second conductor trace, the second plurality of at least nine stages each having a respective value selected from a group of impedance values comprising $Z_{mas}$, $Z_{min}$, and Z, wherein the first conductor trace and the second conductor trace together comprise a differential pair wherein each stage of the first plurality of stages has a respective impedance value that is equal to an impedance value of a respective corresponding stage among the second plurality of at least nine stages.

7. The transmitter optical sub-assembly package of claim 6, further comprising a select portion of the transmitter optical sub-assembly package selected from a group consisting of:
   a fan out portion;
   a feed through portion;
   a flexible circuit portion; and
   a PCB connection portion;
   wherein the select portion of the transmitter optical sub-assembly package comprises at least a portion of the low pass filter.

8. The transmitter optical sub-assembly package of claim 7, wherein the select portion of the transmitter optical sub-assembly package is at least the flexible circuit portion.

9. The transmitter optical sub-assembly package of claim 6, wherein a flexible substrate comprises at least a portion of the low pass filter.

10. A transceiver optical sub-assembly package comprising:
   a transmitter portion;
   a receiver portion;
   circuitry operable to communicate an analog signal along an electrical path in at least one of:
      the transmitter portion, in response to a digital signal the transmitter portion is operable to receive; and
      the receiver portion, in response to an optical signal the receiver portion is operable to receive;
   a low pass filter operable to attenuate frequencies associated with the analog signal that are greater than a predetermined frequency, the low pass filter comprising a first plurality of stages along a first conductor trace, the first plurality of stages each having a respective impedance value selected from a group of impedance values comprising at least a minimum impedance value ($Z_{min}$) and a maximum impedance value ($Z_{max}$) greater than $Z_{min}$, wherein at least a first stage among the first plurality of stages has an impedance value $Z_{max}$ and at least a second stage among the first plurality of stages has an impedance value $Z_{min}$; and
   wherein the low pass filter further comprises a second plurality of stages along a second conductor trace, the second plurality of stages each having a respective impedance value selected from a group of impedance values comprising $Z_{max}$, $Z_{min}$, and Z, wherein the first conductor trace and the second conductor trace together comprise a differential pair wherein each stage of the first plurality of stages has a respective impedance value that is equal to an impedance value of a respective corresponding stage among the second plurality of stages.

11. The transceiver optical sub-assembly package of claim 10, wherein the first plurality of stages further comprises a third stage among the first plurality of stages having an impedance value (z) greater than $Z_{min}$ and less than $Z_{max}$.

12. The transceiver optical sub-assembly package of claim 10, further comprising a select portion of the transceiver optical sub-assembly package selected from a group consisting of:
   a fan out portion;
   a feed through portion;
   a flexible circuit portion; and
   a PCB connection portion; and
   wherein the select portion of the transceiver optical sub-assembly package comprises at least a portion of the low pass filter.

13. The transceiver optical sub-assembly package of claim 12, wherein the select portion of the transceiver optical sub-assembly package is at least the flexible circuit portion.

14. The transceiver optical sub-assembly package of claim 10, wherein a flexible substrate comprises at least a portion of the low pass filter.

15. A receiver optical sub-assembly package comprising:
   digital to analog conversion circuitry;
   circuitry operable to communicate an analog signal along an electrical path extending to the digital to analog conversion circuitry from at least one of a transimpedance amplifier and an automatic gain control circuit;
   a low pass filter operable to attenuate frequencies associated with the analog signal that are greater than a predetermined frequency, the low pass filter comprising a first plurality of stages along a first conductor trace, the first plurality of stages each having a respective impedance value selected from a group of impedance values comprising at least a minimum impedance value ($Z_{min}$) and a maximum impedance value ($Z_{max}$) greater than $Z_{min}$, wherein at least a first stage among the first plurality of stages has an impedance value Zmax and at least a second stage among the first plurality of stages has an impedance valium $Z_{min}$; and
   wherein the low pass filter further comprises a second plurality of stages along a second conductor trace, the second plurality of stages each having a respective impedance value selected from a group of impedance values comprising $Z_{max}$, $Z_{min}$, and Z, wherein the first conductor trace and the second conductor trace together comprise a differential pair wherein each stage of the first plurality of stages has a respective impedance value that is equal to an impedance value of a respective corresponding stage among the second plurality of stages.

16. The transceiver optical sub-assembly package of claim 15, wherein the first plurality of stages further comprises a third stage among the first plurality of stages having an impedance value (z) greater than $Z_{min}$ and less than $Z_{max}$.

17. The transceiver optical sub-assembly package of claim 15, further comprising a select portion of the receiver optical sub-assembly package selected from a group consisting of:
   a fan out portion;
   a feed through portion;
   a flexible circuit portion; and
   a PCB connection portion; and
   wherein the select portion of the receiver optical sub-assembly package comprises at least a portion of the low pass filter.

\* \* \* \* \*